(12) United States Patent
Song

(10) Patent No.: US 10,438,857 B2
(45) Date of Patent: Oct. 8, 2019

(54) SEMICONDUCTOR DEVICE AND METHOD OF MANUFACTURING THEREOF

(71) Applicant: SAMSUNG ELECTRONICS CO., LTD., Suwon-si, Gyeonggi-do (KR)

(72) Inventor: Hyun Seung Song, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 111 days.

(21) Appl. No.: 15/697,689

(22) Filed: Sep. 7, 2017

(65) Prior Publication Data

US 2018/0144994 A1    May 24, 2018

Related U.S. Application Data

(60) Provisional application No. 62/425,445, filed on Nov. 22, 2016.

(51) Int. Cl.
| | |
|---|---|
| *H01L 21/84* | (2006.01) |
| *H01L 29/06* | (2006.01) |
| *H01L 29/417* | (2006.01) |
| *H01L 29/66* | (2006.01) |
| *H01L 29/78* | (2006.01) |

(52) U.S. Cl.
CPC ........ *H01L 21/845* (2013.01); *H01L 29/0649* (2013.01); *H01L 29/41791* (2013.01); *H01L 29/66545* (2013.01); *H01L 29/66795* (2013.01); *H01L 29/785* (2013.01); *H01L 29/7851* (2013.01)

(58) Field of Classification Search
CPC ...................................................... H01L 21/84
See application file for complete search history.

(56) References Cited

U.S. PATENT DOCUMENTS

| 6,188,117 | B1 | 2/2001 | Jan et al. |
|---|---|---|---|
| 6,429,473 | B1 | 8/2002 | Cronin et al. |
| 6,528,363 | B2 | 3/2003 | Ku et al. |
| 8,999,833 | B1 | 4/2015 | Wu et al. |
| 2012/0149202 | A1 | 6/2012 | Pyo |
| 2016/0049525 | A1 | 2/2016 | Liu et al. |

FOREIGN PATENT DOCUMENTS

KR    101002550    12/2010

*Primary Examiner* — Marvin Payen
(74) *Attorney, Agent, or Firm* — F. Chau & Associates, LLC

(57) ABSTRACT

A method of manufacturing a semiconductor device is provided as follows. A fin and an isolation surrounding a lower portion of the fin are formed on a substrate. A plurality of sacrificial gate electrodes is formed on the fin and the isolation. A plurality of recessed upper surfaces of the fin is formed from an upper surface of the fin. An upper surface of the isolation is protected until the plurality of recessed upper surfaces of the fin is formed from the upper surface of the fin. A plurality of source/drains is formed on the plurality of recessed upper surfaces of the fin.

15 Claims, 13 Drawing Sheets

700

SEMICONDUCTOR DEVICE AND METHOD OF MANUFACTURING THEREOF

CROSS-REFERENCE TO RELATED APPLICATION

This application claims the benefit under 35 U.S.C. § 119(e) to U.S. Provisional Patent Application No. 62/425,445, filed on Nov. 22, 2016 in the United States Patent & Trademark Office, the disclosure of which is incorporated by reference herein in its entirety.

TECHNICAL FIELD

The present inventive concept relates to a semiconductor device and a method of manufacturing thereof.

DISCUSSION OF RELATED ART

As transistors are reduced in size, it becomes more difficult to fabricate the transistors in reliable manner in manufacturing processes.

SUMMARY

According to an exemplary embodiment of the present inventive concept, a method of manufacturing a semiconductor device includes forming a plurality of fins on a substrate, and forming an isolation on the substrate. The isolation surrounds a lower portion of each of the plurality of fins. The method further includes forming a plurality of sacrificial gate electrodes on the plurality of fins and the isolation, and forming a preliminary spacer layer to cover conformally the plurality of sacrificial gate electrodes. The method still further includes forming an insulation layer on the preliminary spacer layer, and forming a plurality of insulation patterns on the isolation by recessing a first portion of the insulation layer. The method still includes forming a plurality of recessed upper surfaces of at least one of the plurality of fins by recessing a second portion of the insulation layer and by removing a first lower portion of the preliminary spacer layer. The method further includes forming a plurality of source/drains on the plurality of recessed upper surfaces of at least one of the plurality of fins. The plurality of sacrificial gate electrodes is replaced with a plurality of gate electrodes.

According to an exemplary embodiment of the present inventive concept, a method of manufacturing a semiconductor device includes forming a fin and an isolation surrounding a lower portion of the fin are formed on a substrate, and forming a plurality of sacrificial gate electrodes on the fin and the isolation. The method further includes forming a plurality of recessed upper surfaces of the fin from an upper surface of the fin, and forming a plurality of insulating patterns and a plurality of spacers on an upper surface of the isolation until the plurality of recessed upper surfaces of the fin is formed from the upper surface of the fin. A plurality of source/drains is formed on the plurality of recessed upper surfaces of the fin.

According to an exemplary embodiment of the present inventive concept, a semiconductor device includes a fin extending from a substrate, and an isolation surrounds the fin. The semiconductor device further includes a first active gate electrode disposed on an upper surface of the fin. The semiconductor device still further includes a pair of sidewall spacers disposed on the upper surface of the fin. The first active gate electrode is interposed between one of the pair of sidewall spacers and the other of the pair of sidewall spacers. The semiconductor device further includes a first dummy gate electrode disposed on an upper surface of the isolation, and a pair of U-shaped spacers disposed on the upper surface of the isolation. The first dummy gate electrode is interposed between one of the pair of U-shaped spacers and the other of the pair of U-shaped spacers.

According to an exemplary embodiment of the present inventive concept, a method of constructing an integrated circuit includes forming a plurality of transistors having a plurality of sources/drains on a semiconductor substrate, and forming a fin and an isolation surrounding a lower portion of the fin on the substrate. The method further includes forming a plurality of sacrificial gate electrodes on the fin and the isolation, and forming a plurality of recessed upper surfaces of the fin from an upper surface of the fin. The method still further includes forming a plurality of insulating patterns and a plurality of spacers on an upper surface of the isolation until the plurality of recessed upper surfaces of the fin is formed from the upper surface of the fin. The method still includes forming a plurality of sources/drains on the plurality of recessed upper surfaces of the fin, and manufacturing the integrated circuit having the plurality of transistors.

BRIEF DESCRIPTION OF DRAWINGS

These and other features of the present inventive concept will become more apparent by describing in detail exemplary embodiments thereof with reference to the accompanying drawings of which.

Figure 1:
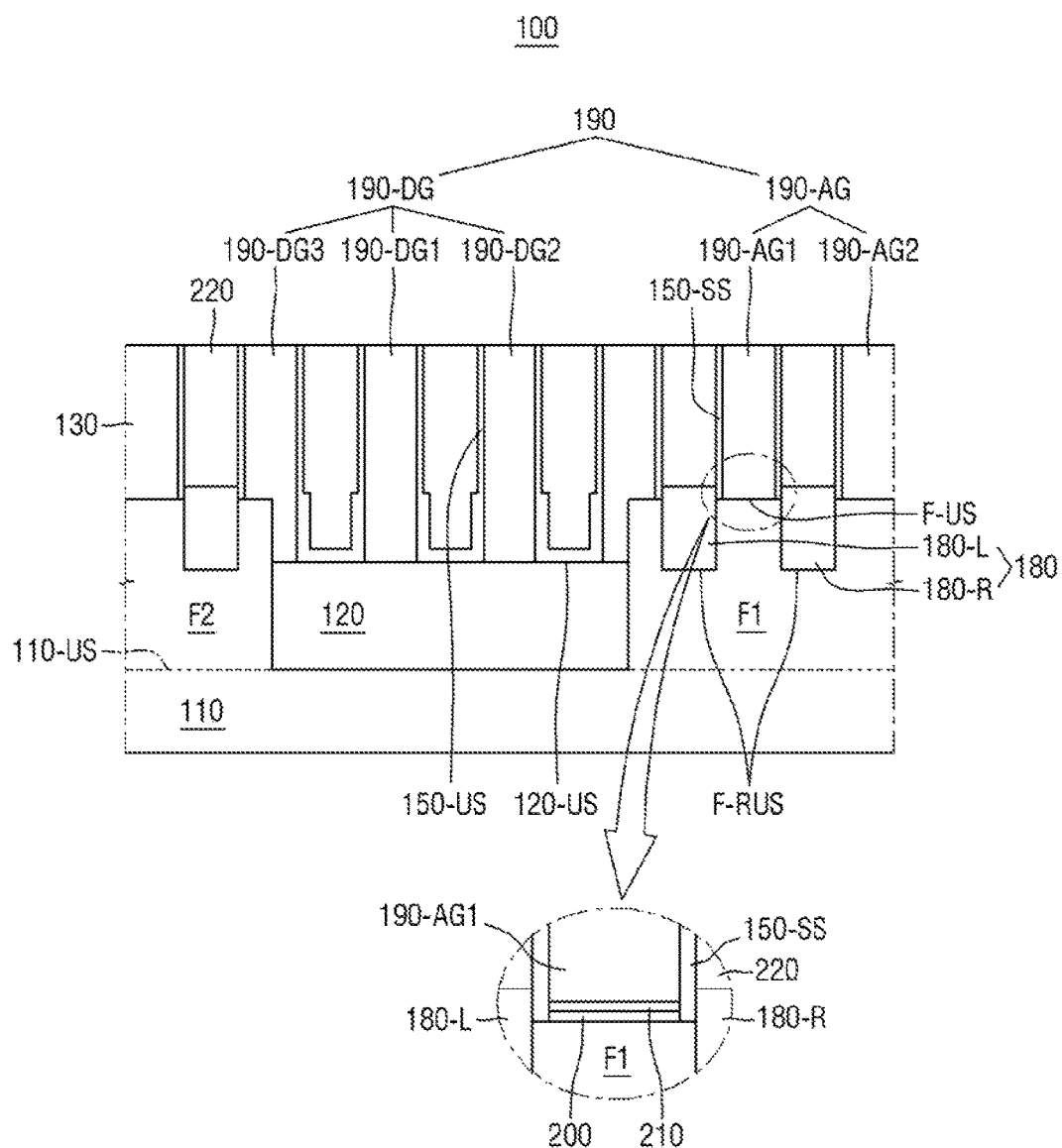
FIG. 1 shows a cross-sectional view of a semiconductor device according to an exemplary embodiment of the present inventive concept.

It will be appreciated that for simplicity and clarity of illustration, elements illustrated in the drawings have not necessarily been drawn to scale. For example, the dimensions of some of the elements are exaggerated relative to other elements for clarity. Further, where considered appropriate, reference numerals have been repeated among the drawings to indicate corresponding or analogous elements.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

DETAILED DESCRIPTION OF EMBODIMENTS

Exemplary embodiments of the present inventive concept will be described below in detail with reference to the accompanying drawings. However, the inventive concept may be embodied in different forms and should not be construed as limited to the embodiments set forth herein. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present.

Hereinafter, a semiconductor device is described with reference to FIG. 1.

FIG. 1 shows a cross-sectional view of a semiconductor device 100 according to an exemplary embodiment of the present inventive concept.

The semiconductor device 100 may include a substrate 110, an isolation 120, a plurality of gate electrodes 190, a plurality of sidewall spacers 150-SS, a plurality of U-shaped spacers 150-US and a plurality of fins F1 and F2.

The plurality of fins F1 and F2 may be protruded from an upper surface 110-US of the substrate 110. For example, each of the first fin F1 and the second fin F2 may be protruded from the upper surface 110-US of the substrate 110. In an exemplary embodiment, the substrate 110 may be formed of silicon (Si) or an alloy of silicon and germanium (SiGe); and the plurality of fins F1 and F2 may be formed of silicon (Si) or an alloy of silicon and germanium (SiGe). In an exemplary embodiment, the substrate 110 and the plurality of fins F1 and F2 may be formed of substantially the same material including silicon (Si) or an alloy of silicon and germanium (SiGe).

The isolation 120 may surround the plurality of fins F1 and F2. For example, the isolation 120 may be disposed on the upper surface 110-US of the substrate 110, surrounding a lower portion of each of the plurality of fins F1 and F2 (see, for example, FIG. 3A). In this case, an upper surface 120-US of the isolation 120 may be lower than the upper surface F-US of the first fin F1. The isolation 120 may be referred to as a shallow trench isolation (STI).

The plurality of gate electrodes 190 may include a plurality of active gate electrodes 190-AG and a plurality of dummy gate electrodes 190-DG.

The plurality of active gate electrodes 190-AG may be disposed on an upper surface F-US of the plurality of fins F1 and F2. The plurality of active gate electrodes 190-AG may include a first active gate electrode 190-AG1 and a second active gate electrode 190-AG2 disposed on the upper surface F-US of the first fin F1 and spaced apart from each other, for example.

A plurality of dummy gate electrodes 190-DG may be disposed on an upper surface 120-US of the isolation 120. The plurality of dummy gate electrodes 190-DG may include a first dummy gate electrode 190-DG1, a second dummy gate electrode 190-DG2 and a third dummy gate electrode 190-DG3. The third dummy gate electrode 190-DG3 may be further disposed on the upper surface F-US of the second fin F2, for example.

A plurality of sidewall spacers 150-SS may be disposed on the upper surface F-US of the plurality of fins F1 and F2. Each of the plurality of sidewall spacers 150-SS may be disposed on a sidewall of the each of the plurality of active gate electrodes 190-AG. In an exemplary embodiment, the first active gate electrode 190-AG1 may be interposed between one of a pair of sidewall spacers 150-SS and the other of the pair of sidewall spacers 150-SS. The second active gate electrode 190-AG2 may be spaced apart from the pair of sidewall spacers 150-SS formed on the sidewalls of the first active gate electrode 190-AG1.

The plurality of U-shaped spacers 150-US may be disposed on the upper surface 120-US of the isolation 120. The first dummy gate electrode 190-DG1, for example, may be disposed between one of a pair of U-shaped spacers 150-US and the other of the pair of U-shaped spacers 150-US. The pair of U-shaped spacers 150-US may be disposed on the upper surface 120-US of the isolation 120. The U-shaped spacer 150-US may be in contact with the first dummy gate electrode 190-DG1 and the second dummy gate electrode 190-DG2. The U-shaped spacer 150-US may be also in contact with the upper surface 120-US of the isolation 120

A plurality of recessed upper surfaces F-RUS of the plurality of fins F1 and F2 may be disposed between two adjacent gate electrodes 190. For example, the recessed upper surface F-RUS of the first fin F1 may be interposed between the first active gate electrode 190-AG1 and the second active gate electrode 190-AG2. The recessed upper surface F-RUS of the first fin F1 may be lower than the upper surface F-US of the first fin F1.

The semiconductor device 100 may further include a source/drain 180 disposed on the recessed upper surface F-RUS of the first fin F1. In an exemplary embodiment, the source/drain 180 may be epitaxially grown from the recessed upper surface F-RUS of the first fin F1.

According to an exemplary embodiment, two sidewall spacers 150-SS disposed between two adjacent active gate electrodes 190-AG1 and 190-AG2 may be separated from each other, facing each other and exposing the upper surface F-US of the first fin F1; and one U-shaped spacer 150-US may be disposed between two adjacent dummy gate electrodes 190-DG1 and 190-DG2, covering the upper surface 120-US of the isolation. For example, the U-shaped spacer 150-US may be in contact with a sidewall of the first dummy gate electrode 190-DG1, a sidewall of the second dummy gate electrode 190-DG2 and the upper surface 120-US of the isolation 120. The sidewall of the first dummy gate electrode 190-DG1 may face the sidewall of the second dummy gate electrode 190-DG2.

In an exemplary embodiment, the first active gate electrode 190-AGI and its two adjacent source/drains 180-L and 180-R may be a part of a transistor. In this case, a current channel between the two adjacent source/drains 180-L and 180-R may be formed along the upper surface F-US of the first fin F1 and beneath the first active gate electrode 190-AG1.

In an exemplary embodiment, the semiconductor device 100 may further include an interfacial silicon oxide 200 and a high-k dielectric gate oxide layer 210 that may be interposed between the first active gate electrode 190-AG1 and the upper surface F-US of the first fin F1 to form the transistor. In an exemplary embodiment, the high-k dielectric gate oxide layer 210 may include hafnium silicon oxynitride (HfSiON). The present inventive concept, however, is not limited thereto.

In an exemplary embodiment, the semiconductor device 100 may further include an interlayer insulating layer 220 filling a space between two adjacent gate electrodes 190. In an exemplary embodiment, the interlayer insulating layer 220 may be formed of a low-k dielectric layer or include an air gap to reduce a capacitive coupling between two adjacent gate electrodes 190.

Hereinafter, a method of manufacturing the semiconductor device 100 of FIG. 1 will be described with respect to FIG. 2, FIGS. 3A and 3B, and FIGS. 4 to FIG. 11.

Figure 2:
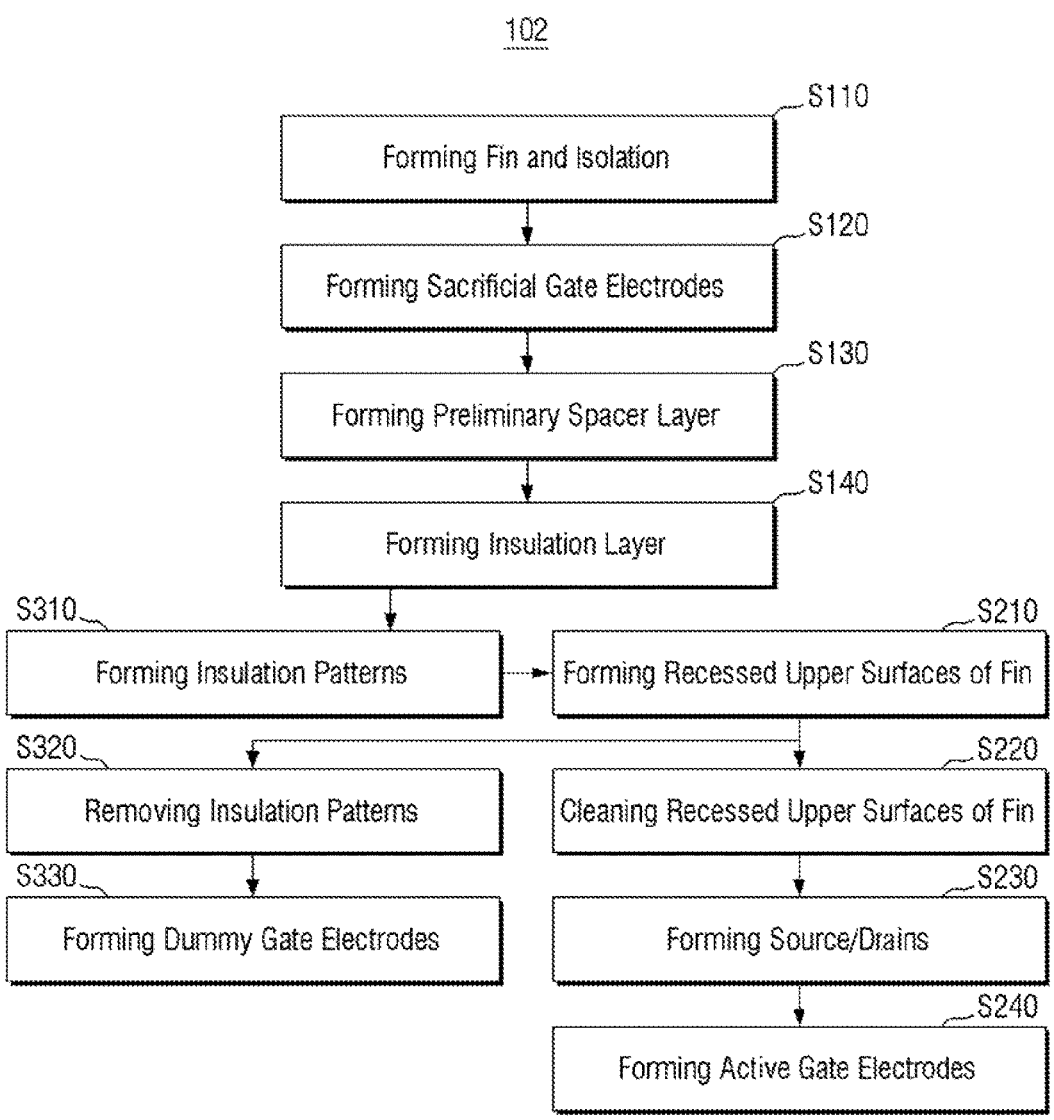
FIG. 2 shows a process flow of manufacturing the semiconductor device of FIG. 1 according to an exemplary embodiment of the present inventive concept.
Figure 3A:
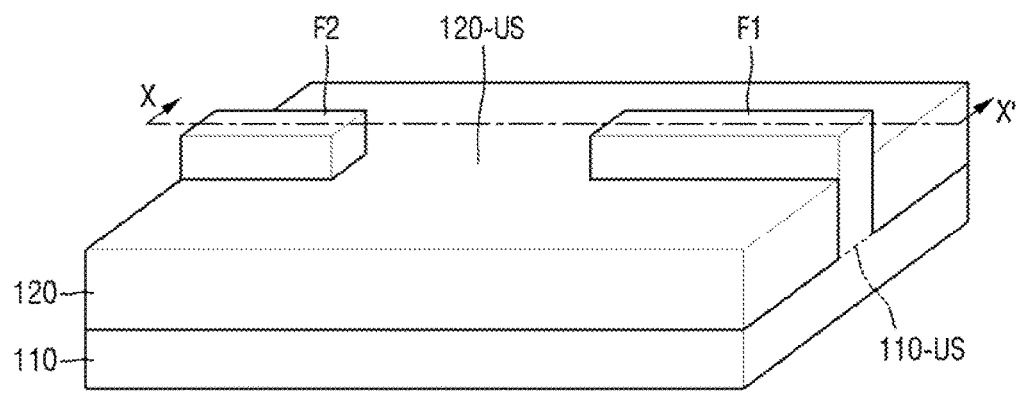
FIG. 3A shows a perspective view of a fin according to an exemplary embodiment of the present inventive concept.

FIG. 2 shows a process flow 102 of manufacturing the semiconductor device 100 according to an exemplary embodiment of the present inventive concept. FIGS. 3A shows a perspective view of a fin according to an exemplary embodiment. FIG. 3B and FIGS. 4 to 11 show cross-sectional views of the semiconductor device 100 taken along the line X-X' of FIG. 3A in the process of manufacturing thereof according to the process flow 102 of FIG. 2.

Figure 3B:
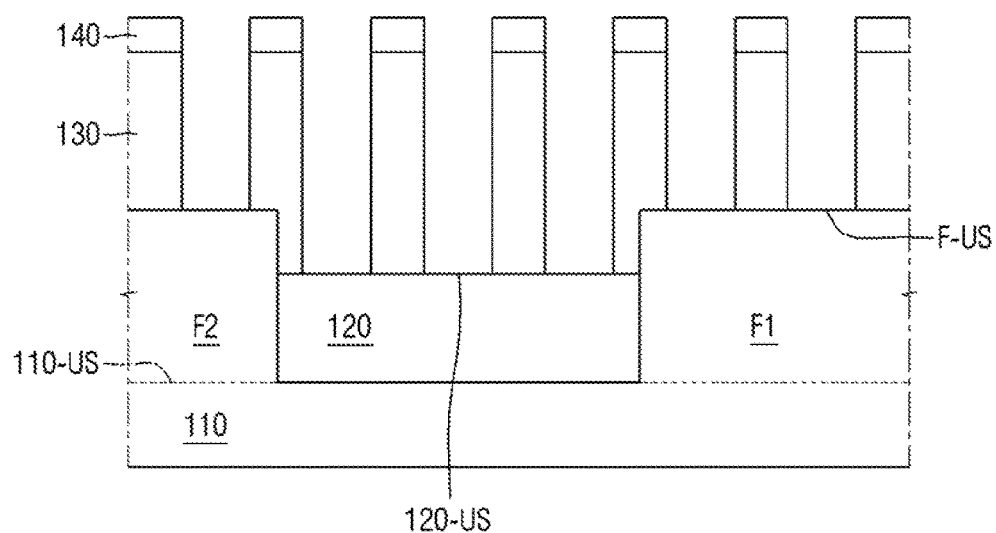
FIG. 3B and FIGS. 4 to 11 show cross-sectional views of the semiconductor of FIG. 1 formed in the process of manufacturing thereof according to the process flow of FIG. 2.

In step S110, the plurality of fins F1 and F2 may be formed on the substrate 110 (see, for example, FIGS. 3A and 3B). The isolation 120 may be formed on the substrate 110. The isolation 120 may surround a lower portion of each of the plurality of fins F1 and F2.

The plurality of fins F1 and F2 may include the first fin F1 and the second fin F2. Each of the first fin F1 and the second fin F2 may be protruded from the upper surface 110-US of the substrate 110. In an exemplary embodiment, the plurality of fins F1 and F2 may be epitaxially grown from the upper surface 110-US of the substrate 110.

In an exemplary embodiment, the substrate 110 may be formed of silicon (Si) or the alloy of silicon and germanium (SiGe), and the plurality of fins F1 and F2 may be formed of silicon (Si) or the alloy of silicon and germanium (SiGe). In an exemplary embodiment, the substrate 110 and the plurality of fins F1 and F2 may be formed of substantially the same material including silicon (Si) or the alloy of silicon and germanium (SiGe).

The isolation 120 may be formed to surround the plurality of fins F1 and F2. For example, the isolation 120 may be disposed on the upper surface 110-US of the substrate 110, surrounding the lower portion of each of the plurality of fins F1 and F2 (FIG. 3A). In this case, the upper surface 120-US of the isolation 120 may be lower than an upper surface F-US of the first fin F1. The isolation 120 may be referred to as a shallow trench isolation (STI).

In an exemplary embodiment, the isolation 120 may be formed of silicon oxide. The present inventive concept, however, is not limited thereto.

In step S120, a plurality of sacrificial gate electrodes 130 may be formed on the plurality of fins F1 and F2 and the isolation 120 (see, for example, FIG. 3B).

A sacrificial gate electrode layer (now shown here) may be formed on the resulting structure of FIG. 3A, covering the plurality of fins F1 and F2 and the upper surface 120-US of the isolation 120. An upper surface of the sacrificial gate electrode layer may be higher than the upper surface of the plurality of fins F1 and F2.

A hardmask layer (not shown here) may be formed on the sacrificial gate electrode layer. In an exemplary embodiment, the hardmask layer may be formed of amorphous carbon material or spin-on-carbon (SOC) hardmask material. The present inventive concept, however, is not limited thereto.

In a photo-lithography process, the hardmask layer may be patterned into a plurality of hardmask patterns 140. In an etching process including, for example, an RIE process, the shape of the plurality of hardmask patterns 140 may be transferred so that the plurality of sacrificial gate electrodes 130 is formed.

Figure 4:
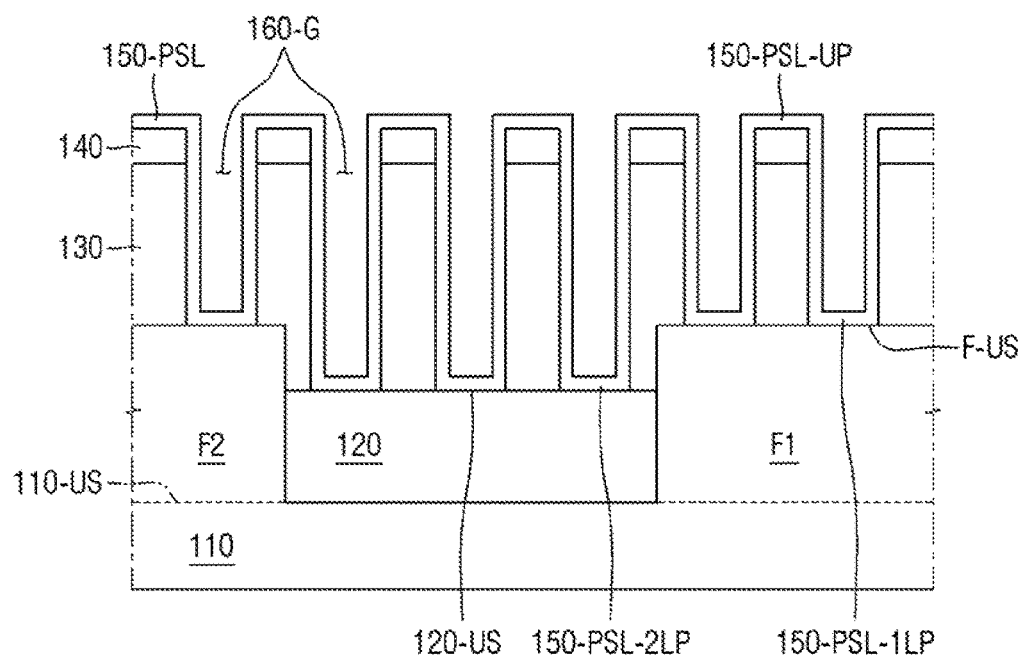

In step S130, a preliminary spacer layer 150-PSL may be formed to cover conformally the plurality of sacrificial gate electrodes 130 (see, for example, FIG. 4). The preliminary spacer layer 150-PSL may include, for example, an upper portion 150-PSL-UP, a first lower portion 150-PSL-1LP and a second lower portion 150-PSL-2LP. The first lower portion 150-PSL-1LP may be in contact with the upper surface F-US of the plurality of fins F1 and F2. The second lower portion 150-PSL-2LP may be in contact with the upper surface 120-US of the isolation 120.

In an exemplary embodiment, the preliminary spacer layer 150-PSL may be formed using chemical vapor deposition (CVD) process including thermal CVD process or plasma-enhanced CVD process, or atomic layer deposition (ALD) process. In an exemplary embodiment, the preliminary spacer layer 150-PSL may be formed of silicon nitride. The present inventive concept, however, is not limited thereto.

Figure 5:
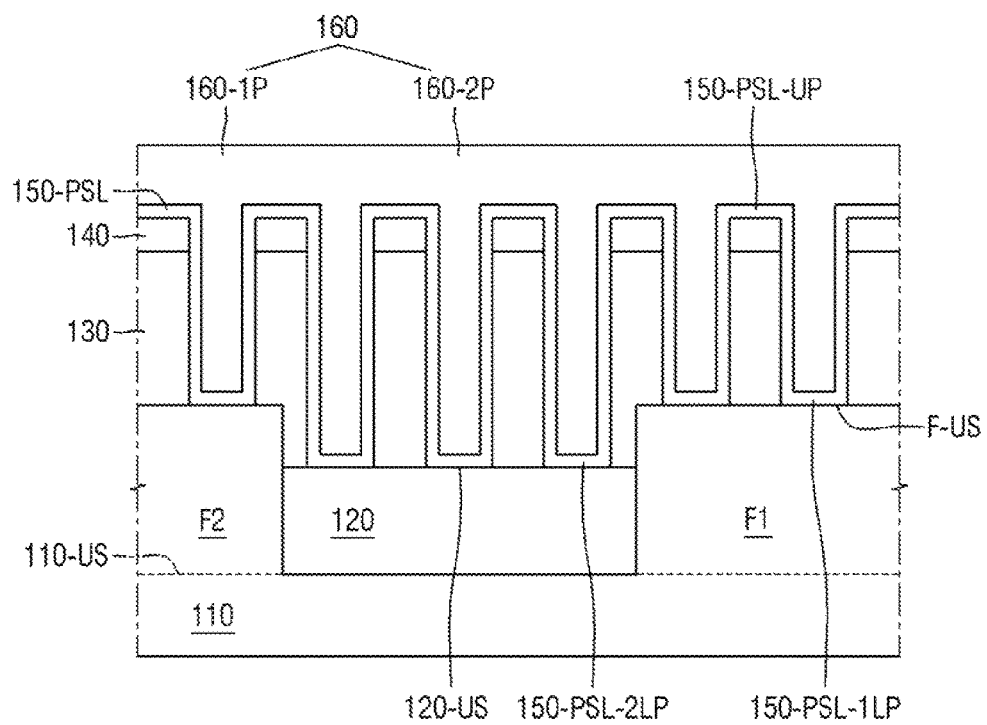

In step S140, an insulation layer 160 may be formed on the preliminary spacer layer 150-PSL as shown in, for example, FIG. 5. The insulation layer 160 may fill a space between two adjacent sacrificial gate electrodes 130, covering the upper portion 150-PSL-UP, the first lower portion 150-PSL-1LP and the second lower portion 150-PSL-2LP of the preliminary spacer layer 150-PSL.

The insulation layer 160 may include a first portion 160-1P and a second portion 160-2P. In one example, the first portion 160-1P of the insulation layer 160 may be disposed on the plurality of fins F1 and F2. The second portion 160-2P of the insulation layer 160 may be disposed on the isolation 120.

In an exemplary embodiment, the insulation layer 160 may be formed of an interlayer dielectric material or the spin-on-carbon (SOC) hardmask material. The insulation layer 160 may be formed using CVD process or spin-on-coating process to fill a gap 160-G (see, for example, FIG. 4) between two adjacent sacrificial gate electrodes 130. For example, the insulation layer 160 may completely fill the gap 160-G. In one example, the height of the insulation layer 160 may be substantially equal to or greater than the height of the sacrificial gate electrodes 130.

In one embodiment, the step S310 may follow the step S140. In step S310, a plurality of insulation patterns 160-P may be formed on the isolation 120 (see, for example, FIG. 6). For example, the insulation layer 160 may be recessed using an etching process including, for example, an RIE process to form the plurality of insulation patterns 160-P. For example, the plurality of insulation patterns 160-P may be what the insulation layer 160 remains after the etching process in step S310.

Each of the plurality of insulation patterns 160-P may be disposed between two adjacent sacrificial gate electrodes 130 disposed on the isolation 120. In this case, the plurality of insulation patterns 160-P may be disposed on the isolation 120, each of the plurality of insulation patterns 160-P covering the second lower portion 150-PSL-2LP of the preliminary spacer layer 150-PSL. The plurality of insulation patterns 160-P may serve to protect the second lower portion 150-PSL-2LP of the preliminary spacer layer 150-PSL in the process of step S210 which will be described below.

Figure 6:
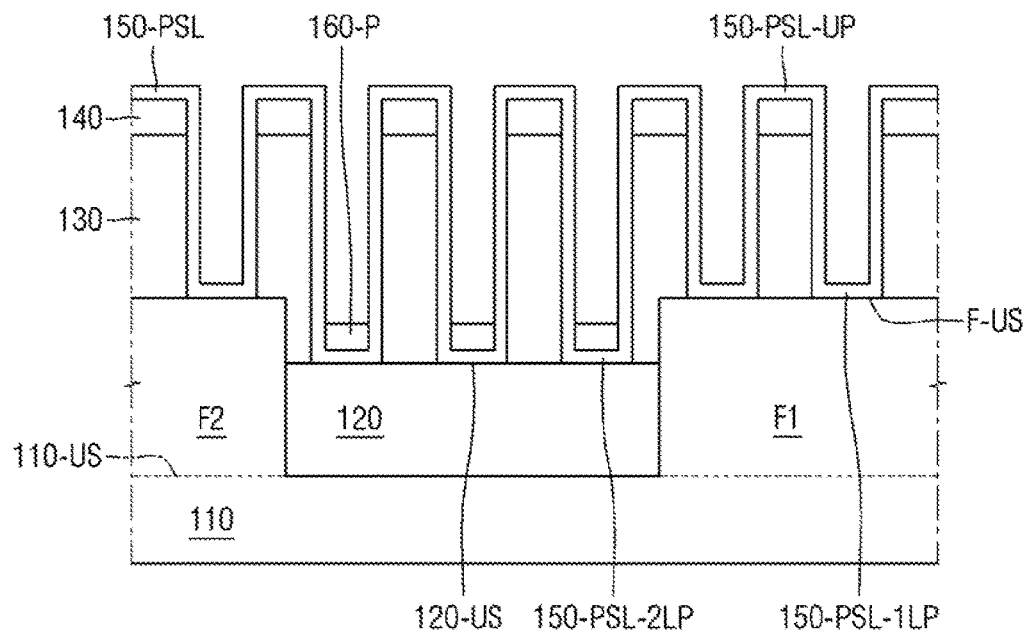

In step S310, the first portion 160-1P of the insulation layer 160 may be substantially completely removed so that the first lower portion 150-PSL-1LP of the preliminary spacer layer 150-PSL may be exposed between two adjacent sacrificial gate electrodes 130 disposed on the plurality of fins F1 and F2 as shown in, for example, FIG. 6.

In one embodiment, the step S310 may be followed by the step 5210. In step S210, a plurality of recessed upper surfaces F-RUS of at least one of the plurality of fins F1 and F2 may be formed by removing the first lower portion 150-PSL-1LP of the preliminary spacer layer 150-PSL as shown in, for example, FIG. 7. The first lower portion 150-PSL-1LP of the preliminary spacer layer 150-PSL may be exposed between two adjacent sacrificial gate electrodes 130 disposed on the plurality of fins F1 and F2 in step 5310.

The second lower portion 150-PSL-2LP of the preliminary spacer layer 150-PSL may be protected in the step S210 by the plurality of insulation patterns 160-P positioned above the second lower portion 150-PSL-2LP.

In an exemplary embodiment, the step S210 and the step 310 may be continuously performed.

In an exemplary embodiment, the first lower portion 150-PSL-1LP may be removed using an etching process to form a plurality of sidewall spacers 150-SS, exposing the upper surface F-US of the plurality of fins F1 and F2 between two adjacent sidewall spacers 150-SS disposed on the plurality of fins F1 and F2.

The exposed upper surface F-US may be recessed to form the plurality of recessed upper surfaces F-RUS in an etching process using the plurality of sidewall spacers 150-SS and the plurality of sacrificial gate electrodes 130 as an etching mask. In this case, each of the plurality of recessed upper surfaces F-RUS of at least one of the plurality of fins F1 and F2 may be exposed between two adjacent sidewall spacers 150-SS.

The height of the plurality of recessed upper surfaces F-RUS of the first fin F1 may be lower than the height of the upper surface F-US of the first fin F1.

In an exemplary embodiment, the recessing of the second portion 160-2P (S210) and the recessing of the first portion 160-1P (S310) may be performed substantially at the same time. In this case, an etching process may be performed to recess the insulation layer 160 until the first lower portion 150-P SL-1LP of the preliminary spacer layer 150-PSL is exposed between two adjacent sacrificial gate electrodes 130 disposed on the plurality of fins F1 and F2. The second lower portion 150-PSL-2LP of the preliminary spacer layer 150-PSL may remain under the plurality of insulation patterns 160-P. In step S310, the insulation layer 160 may be separated into the plurality of insulation patterns 160-P by the etching process of the insulation layer 160 so that each of the plurality of insulation patterns 160-P may be disposed between two adjacent sacrificial gate electrodes 130 and disposed on the isolation 120.

In an exemplary embodiment, the forming of the plurality of recessed upper surfaces F-RUS of at least one of the plurality of fins F1 and F2 may further include forming of a plurality of U-shaped spacers 150-US from the preliminary spacer layer 150-PSL. In step S210, the second lower portion 150-PSL-2LP of the preliminary spacer layer 150-PSL may be protected and the upper portion 150-PSL-UP of the preliminary spacer layer 150-PSL is removed. In one embodiment, during step S210, the upper portion 150-PSL-UP of the preliminary spacer layer 150-PSL may be substantially completely removed. Accordingly, the preliminary spacer layer 150-PSL may be separated into the plurality of U-shaped spacers 150-US.

In an exemplary embodiment, each of the plurality of insulation patterns 160-P may be present within one of the plurality of U-shaped spacers 150-US before step S220 is performed.

According to an exemplary embodiment of the present inventive concept, the forming of the plurality of recessed upper surfaces F-RUS of at least one of the plurality of fins F1 and F2 may include recessing of the first portion 160-1P of the insulation layer 160 until a first lower portion 150-PSL-1LP of the preliminary spacer layer 150-PSL is exposed, removing of the first lower portion 150-PSL-1LP of the preliminary spacer layer 150-PSL to expose at least partially the upper surface F-US of each of the plurality of fins F1 and F2, with the upper surface F-US of each of the plurality of fins F1 and F2 being positioned underneath the first lower portion 150-PSL-1LP of the preliminary spacer layer 150-PSL, and recessing of the exposed upper surface F-US of each of the plurality of fins F1 and F2 in a downward direction to a predetermined depth to form the plurality of recessed upper surfaces F-RUS of at least one of the plurality of fins F1 and F2.

In an exemplary embodiment, the forming of the plurality of insulation patterns 160-P may be performed before the forming of the plurality of recessed upper surfaces F-RUS of at least one of the plurality of fins F1 and F2 is performed. In this case, the plurality of insulation patterns 160-P may serve to protect the second lower portion 150-PSL-2LP of the preliminary spacer layer 150-PSL until the plurality of recessed upper surfaces F-RUS is formed.

Figure 8:
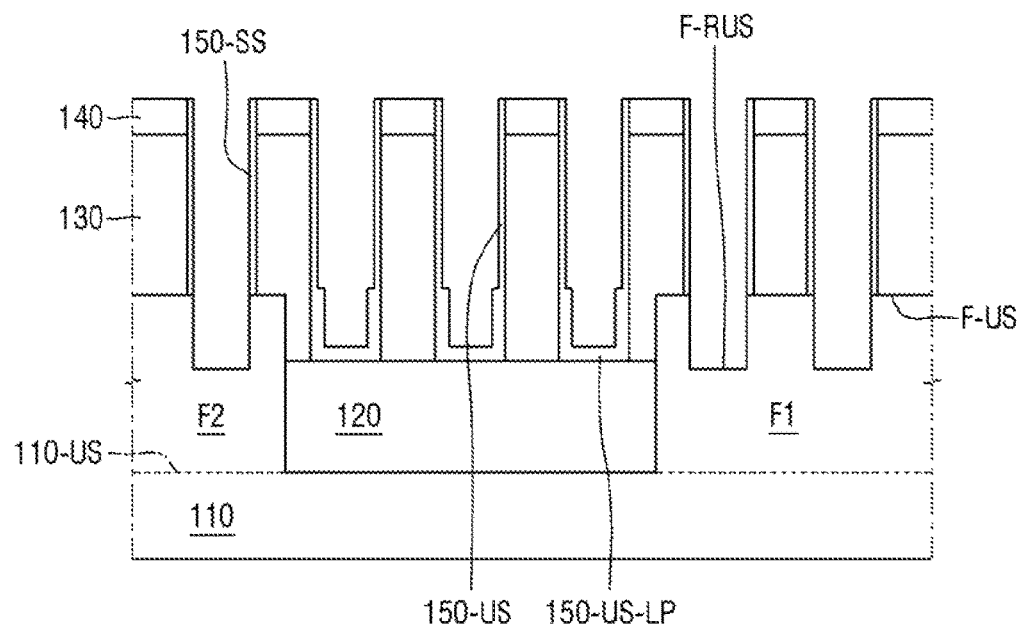

In step S220, the plurality of recessed upper surfaces F-RUS of at least one of the plurality of fins F1 and F2 may be cleaned as shown in, for example, FIG. 8.

In step S320, the plurality of insulation patterns 160-P on the isolation 120 may be removed as shown in, for example, FIG. 8. In an exemplary embodiment, the step S220 and the step S320 may be performed substantially at the same time after S210 is complete.

For example, the cleaning of the plurality of recessed upper surfaces F-RUS and the removing of the plurality of insulation patterns 160-P may be performed using hydrofluoric acid (HF).

In this case, the plurality of the U-shaped spacers 150-US may remain after the cleaning of the plurality of recessed upper surfaces F-RUS.

Step S220 may be followed by step S230. In step S230, a plurality of source/drains 180 may be formed on the plurality of recessed upper surfaces F-RUS of at least one of the plurality of fins F1 and F2 as shown in, for example, FIG. 9. The plurality of source/drains 180 may be epitaxially grown from the plurality of recessed upper surfaces F-RUS of at least one of the plurality of fins F1 and F2. In this case, the plurality of recessed upper surfaces F-RUS may serve as a seed layer when the plurality of source/drains 180 is epitaxially grown.

Figure 9:
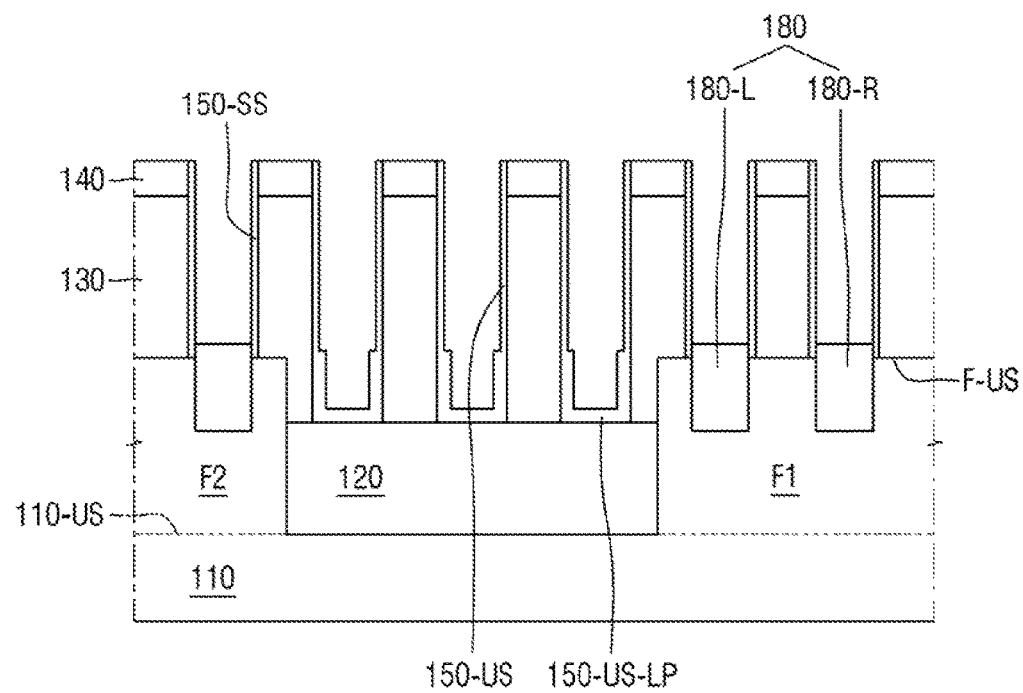
Figure 10:
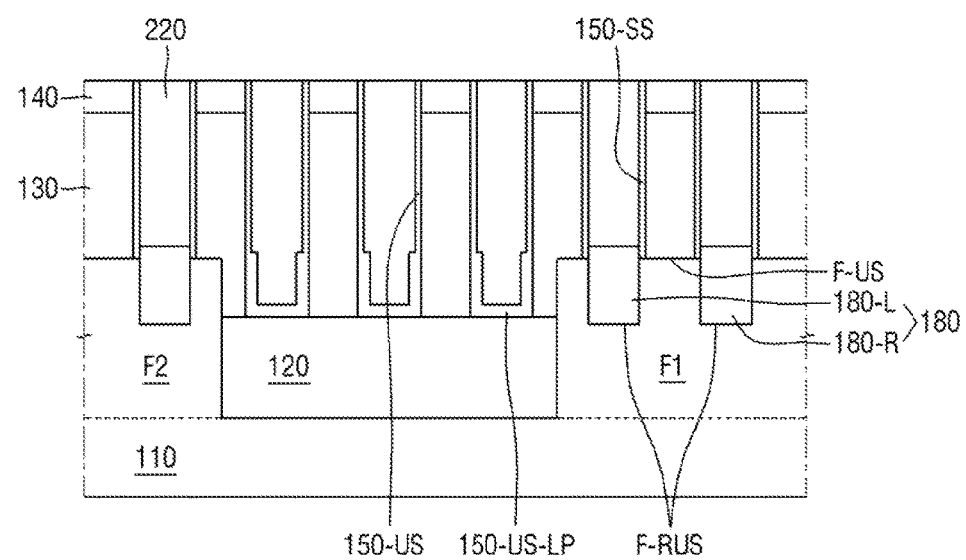
Figure 11:
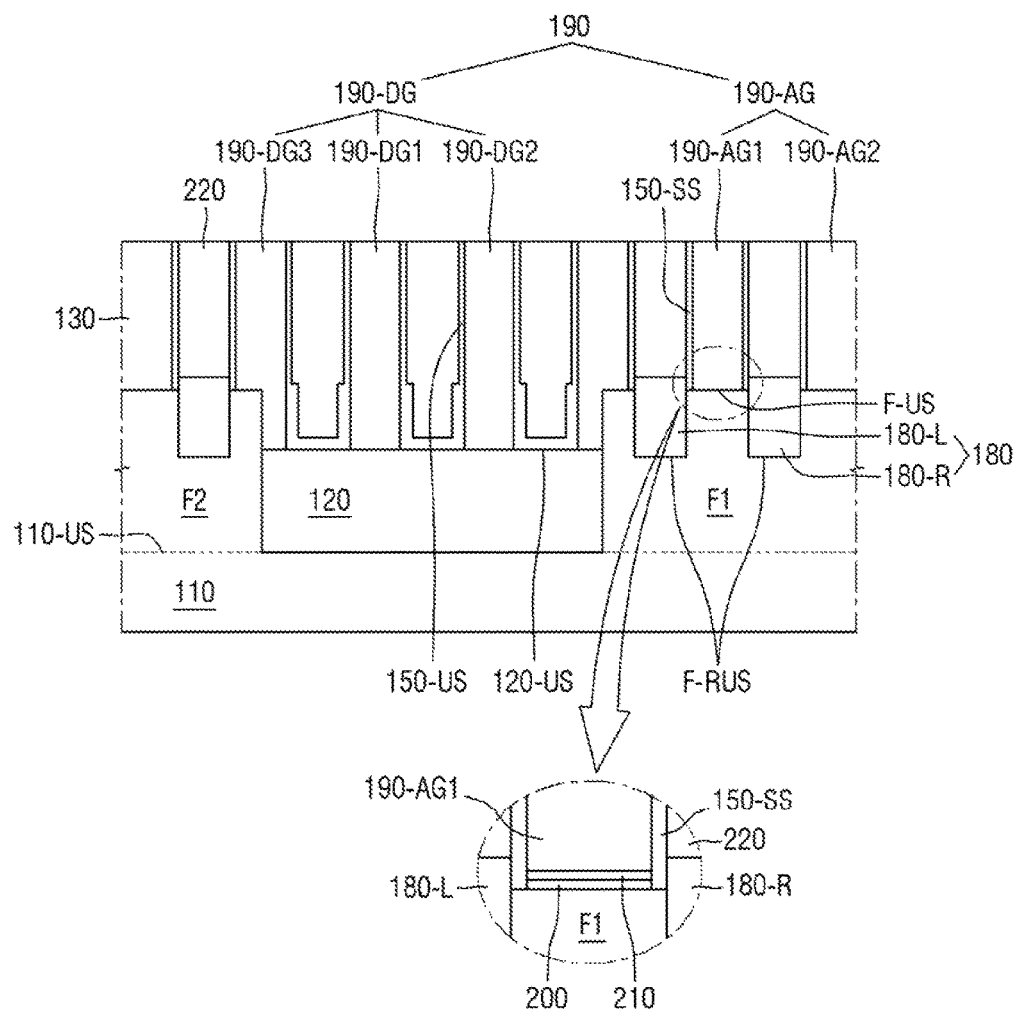

In an exemplary embodiment, an interlayer insulating layer 220 may be formed on the resulting structure of FIG. 9 as shown in, for example, FIG. 10. For example, the interlayer insulating layer 220 may be formed within each of the plurality of U-shaped spacers 150-US or in a space formed by each of the plurality of U-shaped spacers 150-US and the plurality of source/drains 180. The interlayer insulating layer 220 may be formed of, for example, a low-k dielectric layer or an air gap.

Following step 320, the step 330 may be performed. In step S330, the plurality of sacrificial gate electrodes 130 disposed on the isolation 120 may be replaced with a plurality of dummy gate electrodes 190-DG as shown in, for example, FIG. 11. For example, the plurality of dummy gate electrodes 190-DG disposed on the isolation 120 may not serve as transistors.

Following step 230, the step 240 may be performed. In step S240, the plurality of sacrificial gate electrodes 130 disposed on the plurality of fins F1 and F2 may be replaced with a plurality of active gate electrodes 190-AG. For example, the plurality of active gate electrodes 190-AG disposed on the plurality of fins F1 and F2 may serve as transistors. For example, each of the plurality of active gate electrodes 190-AG may be disposed between two adjacent source/drains 180-L and 180-R to serve as the transistor.

In an exemplary embodiment, step S240 and step S330 may be performed substantially at the same time. For example, step S240 and step S330 may be referred to as a replacement-metal-gate (RMG) process.

In the RMG process, the plurality of hardmask patterns 140 and the plurality of sacrificial gate electrodes 130 may be removed and then a metal layer (not shown here) may be formed between the spacers. The metal layer may be planarized to form the plurality of gate electrode 190-AG and 190-DG until a plurality of spacers 150-SS and 150-US is exposed.

Hereinafter, a method of manufacturing the semiconductor device 100 of FIG. 1 will be described with respect to FIG. 12, FIGS. 3A and 3B, FIGS. 4 to FIG. 11.

Figure 12:
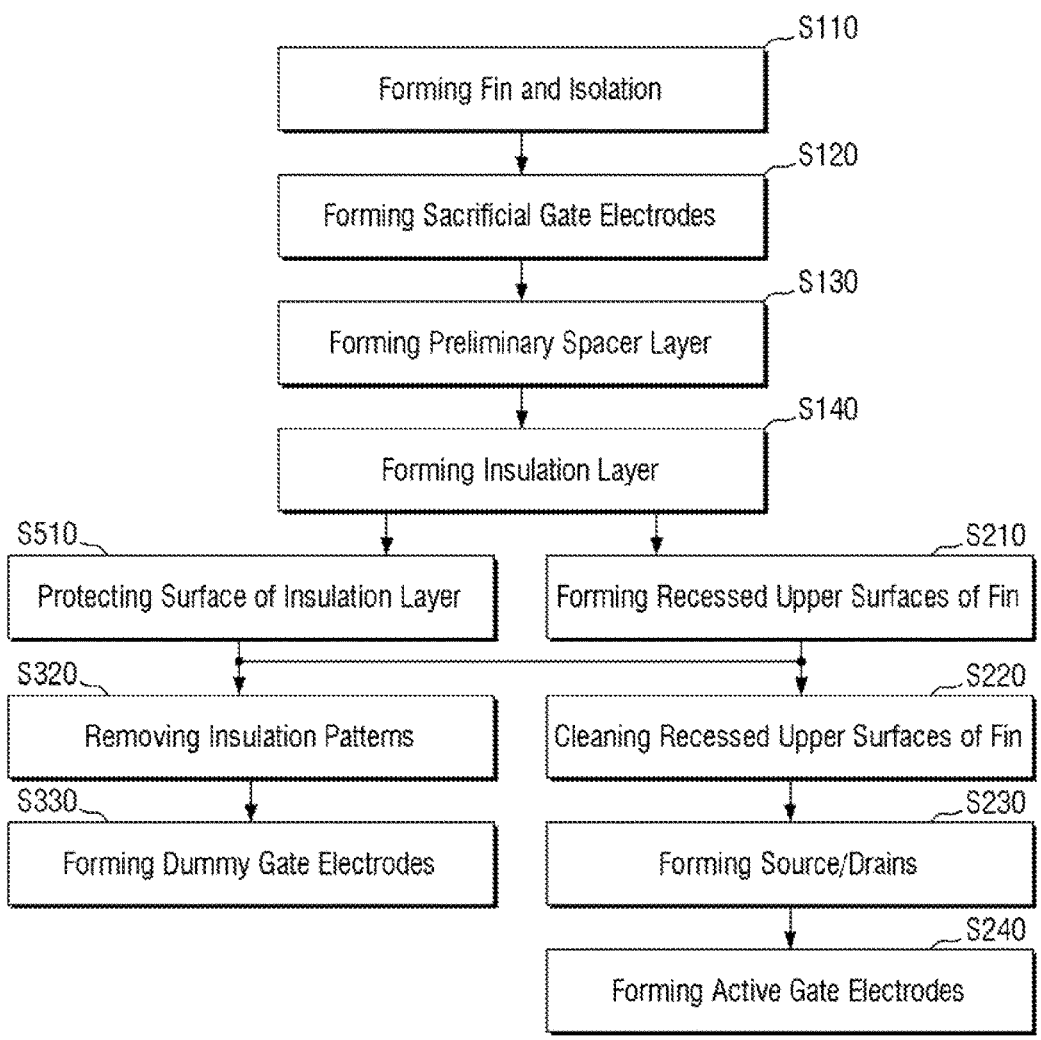
FIG. 12 shows a process flow of manufacturing the semiconductor device of FIG. 1 according to an exemplary embodiment of the present inventive concept.

FIG. 12 shows a process flow 104 of manufacturing the semiconductor device 100 of FIG. 1 according to an exemplary embodiment of the present inventive concept. The steps S110 to S140 of FIG. 12 may be substantially the same as the steps S110 to S140 of FIG. 2. The step S210 of FIG. 12 may be substantially the same as the step S210 of FIG. 2. The steps S320 and S330 of FIG. 12 may be substantially the same as the steps S320 and S330 of FIG. 2. The steps S220 to S240 of FIG. 12 may be substantially the same as the step S220 to S240 of FIG. 2.

The description of the steps S110 to S140, step S210, the steps S320 and S330, and the steps S220 to S240 of FIG. 12 may be omitted for the convenience of the description.

Figure 7:
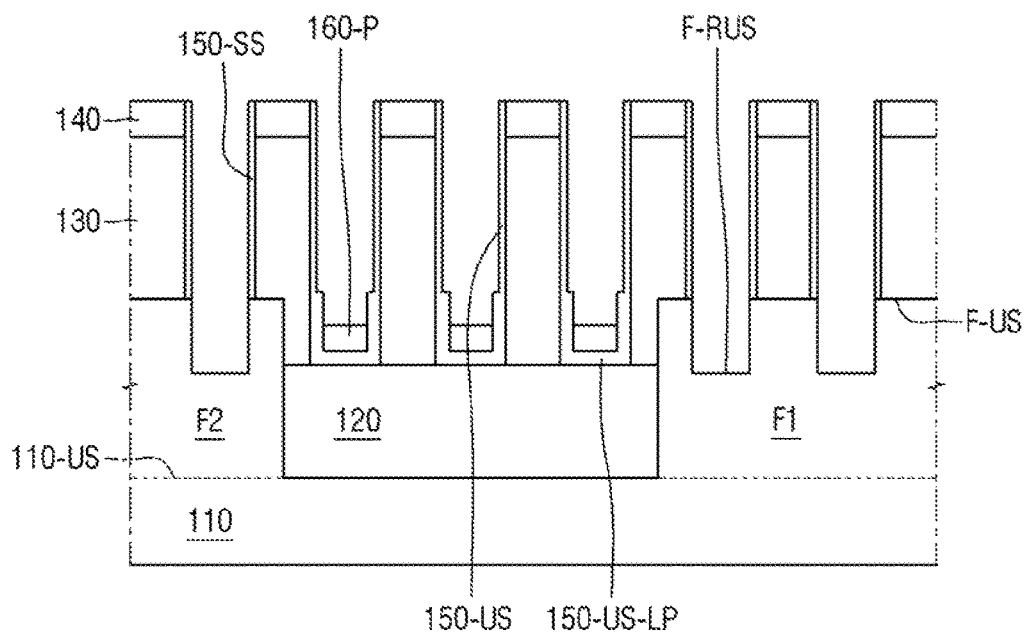

In step S510, the plurality of insulating patterns 160-P and the plurality of U-shaped spacers 150-US may serve to protect the upper surface 120-US in the process of forming the recessed upper surfaces F-RUS of the plurality of fins F1 and F2 as shown in, for example, FIGS. 6 and 7. For example, the plurality of insulating patterns 160-P and the plurality of U-shaped spacers 150-US may protect the upper surface 120-US of the isolation 120 until the plurality of recessed upper surfaces F-RUS of the plurality of fins F1 and F2 is formed from the upper surfaces F-US of the plurality of fins F1 and F2. In one example, the plurality of insulating patterns 160-P and the plurality of U-shaped spacers 150-US may cover the upper surface 120-US of the isolation 120.

In an exemplary embodiment, the protecting of the upper surface 120-US of the isolation 120 may include forming of the plurality of U-shaped spacers 150-US from the preliminary spacer layer 150-PSL on the upper surface 120-US of the isolation 120 and recessing partially of the first portion 160-1P or the second portion 160-2P of the insulation layer 160 on the isolation 120 to form the plurality of insulation patterns 160-P so that each of the plurality of insulation patterns 160-P may cover a lower portion 150-US-LP (see, for example, FIG. 7) of one of the plurality of U-shaped spacers 150-US. In one example, the lower portion 150-US-LP may correspond to the second lower portion 150-PSL-2LP (see, for example, FIG. 6) of the preliminary spacer layer 150-PSL.

Each of the plurality of insulation patterns 160-P may be disposed within one of the plurality of U-shaped spacers 150-US.

Figure 13:
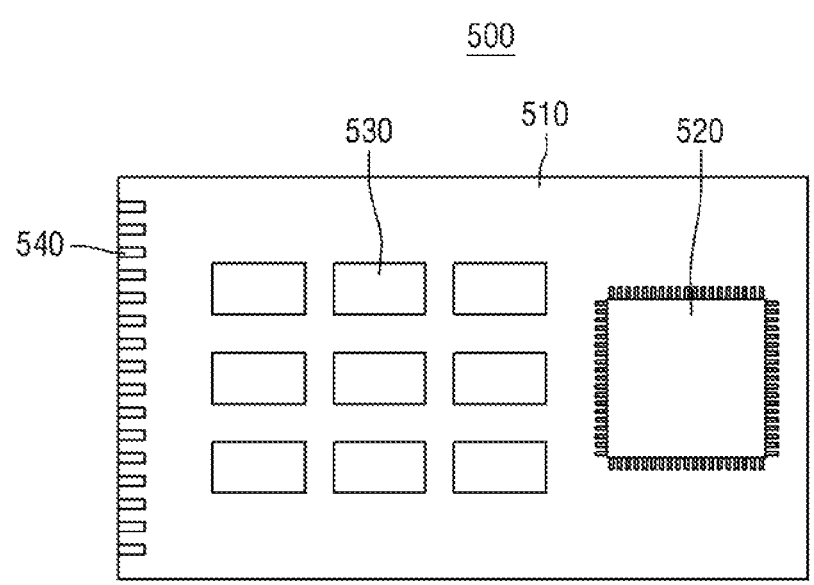
FIG. 13 is a semiconductor module having a semiconductor device manufactured according to an exemplary embodiment of the present inventive concept.

FIG. 13 is a semiconductor module having a semiconductor device manufactured according to an exemplary embodiment of the present inventive concept.

Referring to FIG. 13, the semiconductor module 500 may include a semiconductor device 530. The semiconductor device 530 may be formed according to an exemplary embodiment of the present inventive concept. The semiconductor device 530 may be mounted on a semiconductor module substrate 510. The semiconductor module 500 may further include a microprocessor 520 mounted on the semiconductor module substrate 510. Input/output terminals 540 may be disposed on at least one side of the semiconductor module substrate 510. The semiconductor module 500 may be included in a memory card or a solid state drive (SSD).

Figure 14:
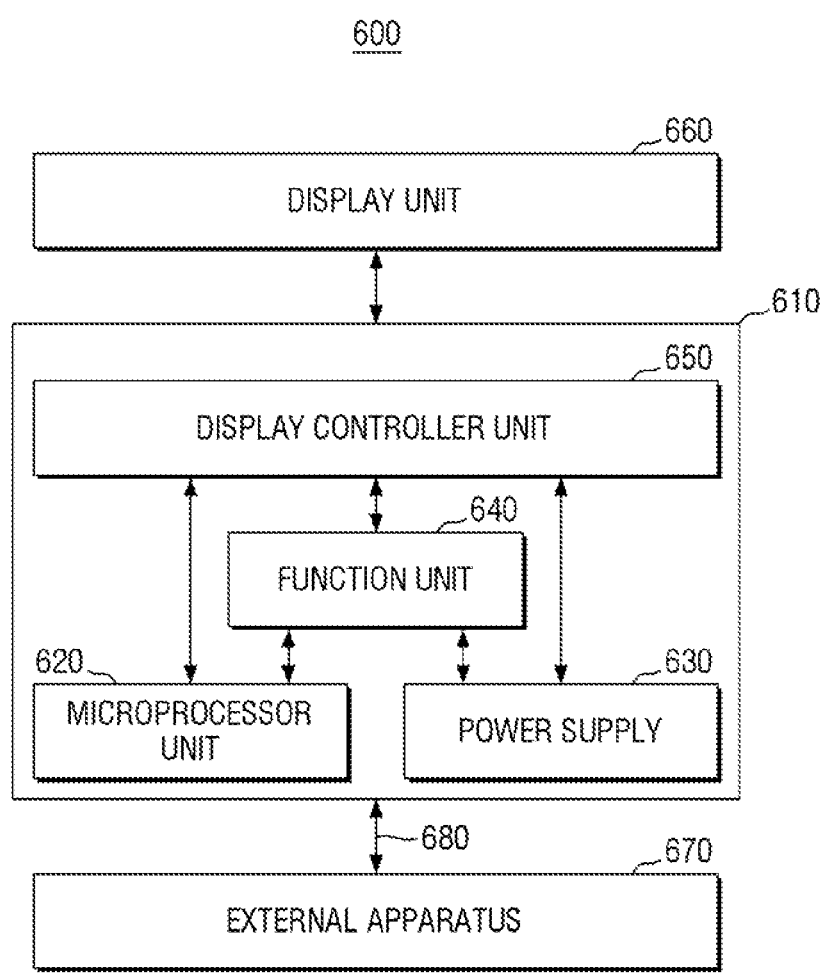
FIG. 14 is a block diagram of an electronic system having a semiconductor device according to an exemplary embodiment of the present inventive concept.

FIG. 14 is a block diagram of an electronic system having a semiconductor device according to an exemplary embodiment of the present inventive concept.

Referring to FIG. 14, a semiconductor device manufactured according to an exemplary embodiment of the present inventive concept may be included in an electronic system 600. The electronic system 600 may include a body 610 including a microprocessor unit 620, a power supply 630, a function unit 640, and a display controller unit 650. The body 610 may include a system board or a motherboard having a printed circuit board (PCB) or the like. The microprocessor unit 620, the power supply 630, the function unit 640, and the display controller unit 650 may be mounted or disposed on the body 610. A display unit 660 may be stacked on an upper surface of the body 610. For example, the display unit 660 may be disposed on a surface of the body 610, displaying an image processed by the display controller unit 650. The power supply 630 may receive a constant voltage from an external power supply, generating various voltage levels to supply the voltages to the microprocessor unit 620, the function unit 640, the display controller unit 650, etc. The microprocessor unit 620 may receive a voltage from the power supply 630 to control the function unit 640 and the display unit 660. The function unit 640 may perform various functions of the electronic system 600. For example, when the electronic system 600 is a mobile electronic product such as a cellular phone, or the like, the function unit 640 may include various components to perform wireless communication functions such as dialing, video outputting to the display unit 660 or voice outputting to a speaker through communication with an external apparatus 670, and when a camera is included, it may serve as an image processor. In an exemplary embodiment, if the electronic system 600 is connected to a memory card to expand the storage capacity, the function unit 640 may serve as a memory card controller. The function unit 640 may exchange signals with the external apparatus 670 through a wired or wireless communication unit 680. Further, when the electronic system 600 requires a Universal Serial Bus (USB) to extend the functions, the function unit 640 may serve as an interface controller. The function unit 640 may include a semiconductor device manufactured according to an exemplary embodiment of the present inventive concept.

Figure 15:
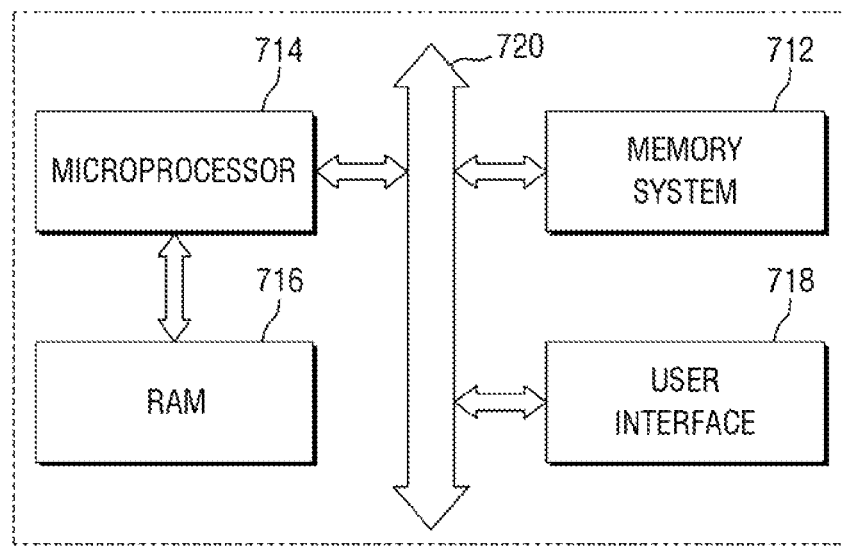
FIG. 15 is a block diagram of an electronic system having a semiconductor device manufactured according to an exemplary embodiment of the present inventive concept.

FIG. 15 is a block diagram of an electronic system having the semiconductor device manufactured according to an exemplary embodiment of the present inventive concept.

Referring to FIG. 15, the electronic system 700 may be included in a mobile device or a computer. For example, the electronic system 700 may include a memory system 712, a microprocessor 714, a random access memory (RAM) 716, and a user interface 718 configured to perform data communication using a bus 720. The microprocessor 714 may program and control the electronic system 700. The RAM 716 may be used as an operational memory of the microprocessor 714. For example, the microprocessor 714 or the RAM 716 may include a semiconductor device manufactured according an exemplary embodiment of the present inventive concept.

The microprocessor 714, the RAM 716, and/or other components may be assembled within a single package. The user interface 718 may be used to input or output data to or from the electronic system 700. The memory system 712 may store operational codes of the microprocessor 714, data processed by the microprocessor 714, or data received from the outside. The memory system 712 may include a controller and a memory.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A method of manufacturing a semiconductor device, comprising:
    forming a plurality of fins on a substrate;
    forming an isolation on the substrate, the isolation surrounding a lower portion of each of the plurality of fins;
    forming a plurality of sacrificial gate electrodes on the plurality of fins and the isolation;
    forming a preliminary spacer layer to cover conformally the plurality of sacrificial gate electrodes;
    forming an insulation layer on the preliminary spacer layer;
    forming a plurality of insulation patterns on the isolation by recessing a first portion of the insulation layer;
    forming a plurality of recessed upper surfaces of at least one of the plurality of fins by recessing a second portion of the insulation layer and by removing a first lower portion of the preliminary spacer layer;
    forming a plurality of source/drains on the plurality of recessed upper surfaces of at least one of the plurality of fins; and
    replacing the plurality of sacrificial gate electrodes with a plurality of gate electrodes.

2. The method of claim 1,
wherein the forming of the plurality of insulation patterns is performed before the forming of the plurality of recessed upper surfaces of at least one of the plurality of fins is performed.

3. The method of claim 1,
wherein the forming of the plurality of recessed upper surfaces of at least one of the plurality of fins includes:
    forming a plurality of sidewall spacers from the preliminary spacer layer by removing the first lower portion of the preliminary spacer layer,
    wherein each of the plurality of recessed upper surfaces of at least one of the plurality of fins is exposed between two adjacent sidewall spacers of the plurality of sidewall spacers.

4. The method of claim 1,
wherein the forming of the plurality of recessed upper surfaces of at least one of the plurality of fins includes:
    forming a plurality of U-shaped spacers from the preliminary spacer layer.

5. The method of claim 4,
wherein each of the plurality of insulation patterns is disposed within one of the plurality of U-shaped spacers.

6. The method of claim 1,
wherein the forming of the plurality of insulation patterns includes:
    forming a plurality of U-shaped spacers from the preliminary spacer layer, and
    wherein each of the plurality of insulation patterns is disposed within one of the plurality of U-shaped spacers.

7. The method of claim 1, further comprising:
    cleaning the plurality of recessed upper surfaces of at least one of the plurality of fins,
    wherein the plurality of source/drains is epitaxially grown from the plurality of recessed upper surfaces of at least one of the plurality of fins after the cleaning of the plurality of recessed upper surfaces of at least one of the plurality of fins.

8. The method of claim 7,
wherein the cleaning of the plurality of recessed upper surfaces of at least one of the plurality of fins includes:
    removing the plurality of insulation patterns.

9. The method of claim 1,
wherein the preliminary spacer layer is formed of silicon nitride.

10. The method of claim 1,
wherein the insulation layer is formed of an interlayer dielectric material or a spin-on-carbon (SOC) hardmask material.

11. The method of claim 1,
wherein an upper surface of the isolation is lower than an upper surface of each of the plurality of fins.

12. The method of claim 1,
wherein the forming of the plurality of recessed upper surfaces of at least one of the plurality of fins includes:
    recessing the second portion of the insulation layer until the first lower portion of the preliminary spacer layer is exposed;
    removing the first lower portion of the preliminary spacer layer to expose partially an upper surface of each of the plurality of fins, the upper surface of each of the plurality of fins being underneath the first lower portion of the preliminary spacer layer; and
    recessing the exposed upper surface of each of the plurality of fins to a predetermined depth to form the plurality of recessed upper surfaces of at least one of the plurality of fins.

13. A method of manufacturing a transistor, the method comprising:
    forming a fin and an isolation surrounding a lower portion of the fin on a substrate;
    forming a plurality of sacrificial gate electrodes on the fin and the isolation;
    forming a plurality of recessed upper surfaces of the fin from an upper surface of the fin;
    forming a plurality of insulating patterns and a plurality of spacers on an upper surface of the isolation until the plurality of recessed upper surfaces of the fin is formed from the upper surface of the fin;

forming a plurality of source/drains on the plurality of recessed upper surfaces of the fin;

forming a preliminary spacer layer covering conformally the plurality of sacrificial gate electrodes; and forming an insulation layer on the preliminary spacer layer, wherein a first portion of the insulation layer covers the isolation, and wherein a second portion of the insulation layer covers the fin.

14. The method of claim 13, wherein the forming of the plurality of recessed upper surfaces of the fin includes:

recessing partially an upper surface of the fin to form the plurality of recessed upper surfaces of the fin.

15. The method of claim 13, wherein the plurality of spacers are U-shaped and each of the plurality of insulation patterns is disposed within one of the plurality of spacers.

* * * * *